United States Patent [19]

Jungfer, deceased et al.

[11] 4,153,867
[45] May 8, 1979

[54] DEVICE FOR DETERMINING THE CHARGE CONDITION FOR A SECONDARY ELECTRIC STORAGE BATTERY

[75] Inventors: Leopold Jungfer, deceased, late of Klagenfurt, Austria; by Helmut Jungfer, heir, Klagenfurt, Austria; by Ingeborg Meyenburg, heir, Rosental, Austria; Dieter Kautschitsch, Feistritz im Ronsental, Austria; Richard Weber, Klagenfurt, both of Austria

[73] Assignee: Akkumulatoren-fabrik Dr. Leopold Jungfer, Feistritz im Rosental, Austria

[21] Appl. No.: 851,346

[22] Filed: Nov. 14, 1977

[30] Foreign Application Priority Data

Nov. 16, 1976 [AT] Austria ................................. 8515/76

[51] Int. Cl.² ........................ H02J 7/10; H01N 27/42
[52] U.S. Cl. ........................................ 320/43; 320/48; 324/29.5
[58] Field of Search ................................. 320/43–45, 320/48; 324/29.5, 76; 340/249

[56] References Cited

U.S. PATENT DOCUMENTS

| 3,895,284 | 7/1975 | Schweizer et al. | 320/48 |
| 3,898,548 | 8/1975 | Perelle et al. | 320/48 |
| 3,906,329 | 9/1975 | Bader | 320/48 X |
| 3,971,980 | 7/1976 | Jungfer et al. | 320/48 X |

*Primary Examiner*—Robert J. Hickey
*Attorney, Agent, or Firm*—Ernest F. Marmorek

[57] ABSTRACT

A device for determining the charge condition of a secondary electric storage battery, and including a digital integrator comprising a pulse generator for producing pulses at a frequency proportional to the magnitude of the instantaneous battery current, and an up-down counter for counting the pulses in a sense (i.e. up or down) dependent upon the battery current direction. A switching arrangement operates to couple selectively the pulse generator or an adjustment pulse generator to the counter, and a comparator controls the supply of pulses to, and the sense of counting in the counter, when the adjustment pulse generator is coupled thereto in accordance with the result of a comparison of the counter setting and of a function signal. A function generator, programmable in accord with the relationship between temperature, no-load voltage, and charge condition of the battery concerned, is controllable in accord with the instantaneous temperature and no load voltage of the battery so as to generate the function signal to represent the associated charge condition.

4 Claims, 1 Drawing Figure

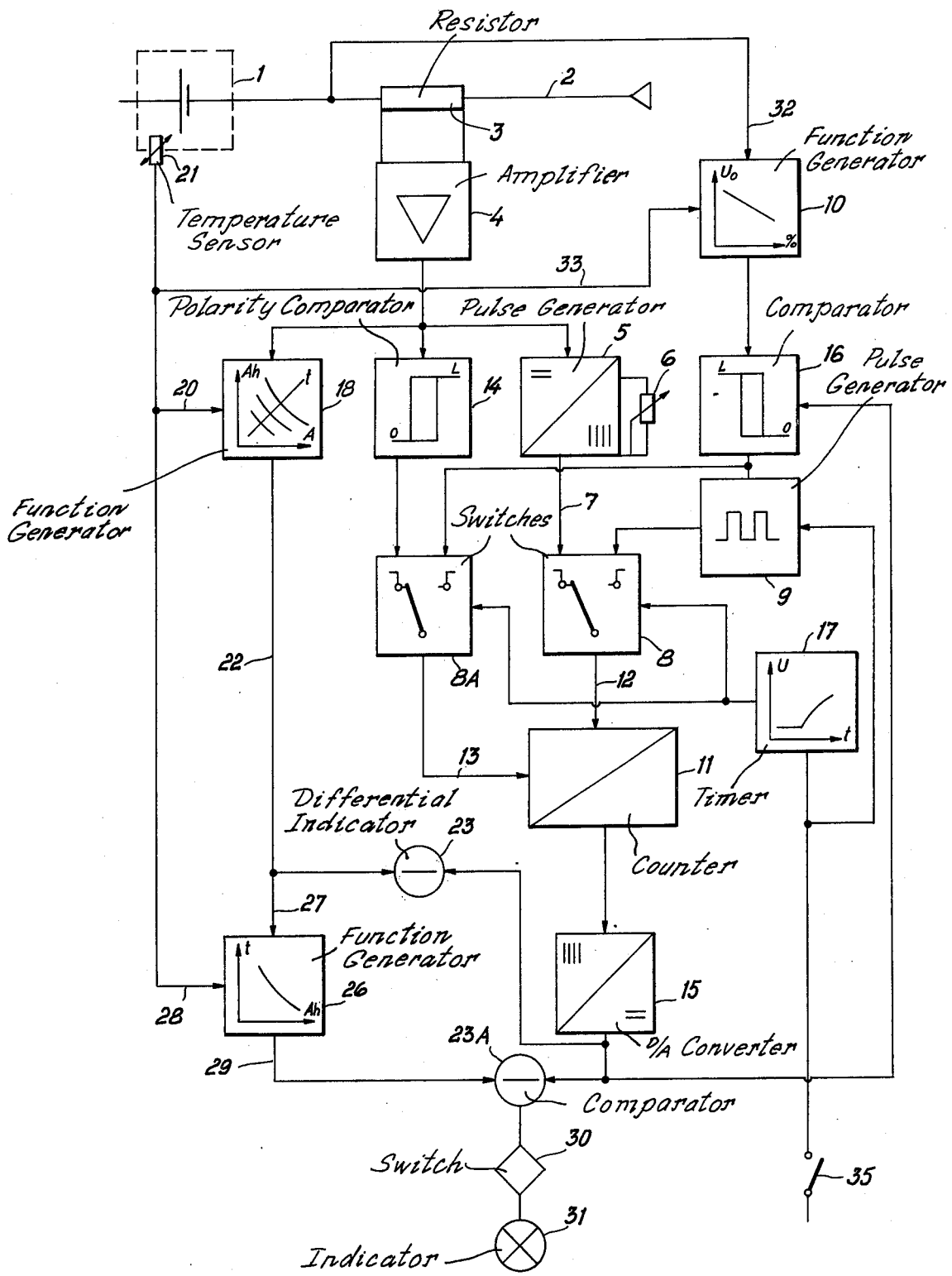

DEVICE FOR DETERMINING THE CHARGE CONDITION FOR A SECONDARY ELECTRIC STORAGE BATTERY

The invention relates to a device for determining the charge condition of a secondary electric storage battery, and more particularly to a device having an integrator which responds to the charge and discharge current of the secondary battery, and which comprises a pulse generator whose frequency is variable in proportion to the magnitude of the battery current and to whose output is connected an up-down counter the direction of counting of which is controlled in dependence on the battery-current direction.

Devices of this type may be designed for motor vehicle batteries so that they indicate, in similar manner to a petrol gauge, the number of ampere-hours which are available from the battery at any particular time, or else in such a way that they indicate whether the number of ampere-hours which are still available from the battery is sufficient to ensure reliable starting of the motor vehicle.

It has now been found that indicating devices of this type can give false readings in protracted service as a result of small unavoidable errors in the derivation of the measured quantity proportional to the battery current and in the conversion of the measured quantity into counting pulses. These errors, coupled with temperature varying characteristics of the circuit elements used, and integrated over a relatively long integration time, necessitate periodic readjustment of the instrument to avoid excessively inaccurate readings being given. Furthermore, when replacing the battery it is necessary to preadjust the device by matching the counter setting to the condition of the new battery.

The object of the invention is to avoid or at least partly alleviate the aforementioned problems.

In accordance with the invention therefore, there is provided a device for determining the charge condition of a secondary electric storage battery, having an integrator for responding to the charge and discharge current of the secondary battery and which comprises a pulse generator for producing pulses at a frequency which can be varied in accordance with the magnitude of the battery current an up-down counter for counting the pulses from the pulse generator in a sense dependent upon the battery current direction, switch means for selectively coupling the said pulse generator, or a further adjusting pulse generator to the up-down counter, and a comparator for controlling the supply of pulses to the up-down counter and the sense of counting therein when said further pulse generator is coupled thereto, in accordance with the result of a comparison of the counter setting and of a signal supplied by a function generator which is programmable in accordance with relationship between no-load voltage, temperature and charge condition of the battery concerned, to generate said signal to represent the charge condition associated with a particular detected no-load voltage and temperature.

The device according to the invention thus relies for its operation upon the known fact that at a known temperature and after a set minimum time lapse after the last charge or discharge, sufficient to allow for recovery from the diffusion processes associated with the variation in the battery charge condition, the no-load voltage of a secondary battery is directly related to the particular charge condition, so that it is possible to determine the charge condition of the battery by means of a function generator which is controlled in accordance with the temperature and no-load voltage of a secondary battery and which is programmed in accordance with the particular relationship between temperature, no-load voltage and charge condition for the battery concerned. The result of this determination is, of course, only valid under the aforementioned conditions, i.e. after a predetermined long rest period of the battery, and not if the battery has been charged or discharged continuously or in relatively brief intervals.

If, using the switching means provided in the device according to the invention, the adjusting pulse generator is briefly cut in, after expiry of the recovery time for any diffusion processes in the battery, the counter setting is corrected so that cumulative errors in the reading are eliminated. It is in general necessary for the battery to remain inoperative for several hours before this adjustment can effectively be made. Since a premature actuation of the switching means would cause faulty adjustment, the switching means in accord with a preferred embodiment of the invention incorporates a time switch which can be made to start timing upon disconnection of the battery and which is capable, after the elapse of a predetermined time which is just sufficient to allow for recovery of the battery under no-load from the diffusion processes of causing the switching means to couple the counter to the adjusting pulse generator, so that when the battery is reconnected there necessarily takes place firstly an adjustment of the indicating device. If the battery is reconnected before expiry of the mentioned recovery period, it is of course necessary for the time switch to be capable of being reset so as to avoid faulty adjustment, and likewise it is of course necessary for an automatic resetting of the time switch to be effected after completion of the adjustment.

An embodiment of the invention will now be described by way of example, with reference to the accompanying drawing, the single figure of which illustrates schematically, in block diagram form, a device for determining the charge condition of a secondary storage battery.

The FIGURE shows a starter battery 1 in whose circuit 2 is placed a small resistor 3 from which a measurement voltage is tapped and fed to a measuring amplifier 4. The output voltage of the measuring amplifier 4 is supplied to the control input of a voltage controlled variable frequency pulse generator 5, the output of which therefore comprises a train of pulses at a frequency proportional to the magnitude of the voltage from the amplifier 4. This pulse generator 5 includes a control element 6 by which it is possible to adjust the output frequency, depending on the charge factor (efficiency) of the battery 1, in such a way that a charge current of any given magnitude gives rise to an output frequency which is smaller by an amount corresponding to the charge factor, than the frequency produced by a discharge current of the same magnitude.

The output line 7 from the pulse generator 5 is coupled to the input of a switch 8 whose output line 12 is connected to the count input of a digital up-down counter 11 which, for example, has four counting decades. This counter 11 is controlled to count down during charging and up during discharge, so that it delivers and stores a digital output signal which indicates the resultant ampere-hour consumption, starting from a predetermined fully charged condition. In order to control the counting direction of the counter 11 in accord with the sense, charge or discharge, of the battery current, a polarity comparator 14 is connected to sense the polarity of the output of the amplifier 4, and to deliver an appropriate control signal to the up-down control input 13. A switch 8A is connected between this comparator 14 and the counter 11.

Coupled to the output of the counter 11 is a digital-to-analogue converter 15 which supplies an analogue voltage corresponding to the instantaneous digital content of the counter. This voltage has the value 0 when the battery 1 is fully charged and increases as the level of discharge rises.

Also connected to the output of the measuring amplifier 4 is a load-current function generator 18 which is programmed according to the relationship between discharge current, temperature and ampere-hour consumption and which is controlled on the one hand, at an input 19 from the measuring amplifier 4 according to the particular discharge current and, on the other hand, at an input 20 from a temperature sensor 21 according to the operating temperature of the battery 1. At its output 22, the generator 18 supplies an analogue voltage which indicates the number of ampere hours which are available at the operative temperature and at that particular discharge current.

Coupled to the output 22 of the function generator 18 is a differential indicator 23, to which the output of the digital-to-analogue converter 15 is also connected and which, like a petrol gauge, indicates the number of ampere-hours which can still be taken from the battery. Moreover, the output 22 of the function generator 18 can be coupled to another function generator 26 which is programmed according to the relationship between minimum ampere-hour requirement and temperature and is controlled at a second input 28 from the temperature sensor 21. The analogue signal in the output 29 of this function generator 26 is applied to one input of an ampere-hour comparator 23A whose other input receives the output of the digital-to-analogue converter 15 and whose output is coupled to a pivotable switch stage 30 which responds whenever the comparison signal from the converter 15 is equal to or greater than the comparison signal from function generator 26 and in that case delivers an output signal to an indicator 31 which, for example, provides a visual or acoustic warning signal when the battery can only just satisfy the minimum ampere-hour requirement. Thus, when used in motor vehicles, the driver is given prompt warning before exhaustion of the battery occurs, which would be detrimental to starting ability.

In order to ensure in protracted service that the counter 11 does not accumulate a significant error as a result of integration of small errors in the chain of instrument components 3, 4, 5, 14 and 12 an adjusting pulse generator 9 is provided which by means of the switch 8 can be connected to the counter 11 instead of the pulse generator 5. The pulse transfer from the generator 9 to the counter 11 is effected under the control of a comparator 16 either, as shown in the drawing, by direct control of the generator 9 or else by means of an intermediate gate circuit coupled in the output thereof, said comparator 16 comparing the counter setting of the counter 11, converted by the impulse 15 into an analogue signal, with the output signal from a function generator 10. This function generator 10 is controlled via a line 32 by the no-load voltage of the battery 1 and via another line 33 by the temperature sensor 21 and is so programmed, according to the type of battery, that, depending on the measured values of the no-load voltage and the temperature it delivers a signal indicating the charge condition of the battery. If the two input signals to the comparator 16 have different values, the inpulse generator 9 supplies adjusting pulses via the switch 8 to the counter 11, which is additionally controlled by the comparator 16 via the switch 8A in accordance with the polarity of the comparison result, so that the adjusting pulses are fed into the counter 11 at a rate, and a sense (i.e. up or down) according to the magnitude and the sense of the deviation of the counter setting from the value indicated by the function generator 10.

The changing-over of the switches 8 and 8A is carried out advantageously by means of a time switch 17 which is set for a switching period lasting several hours, e.g. 8 hours, so as to ensure that change-over to adjustment is possible in each case only after cessation of the diffusion processes in the battery, after the last charge of discharge thereof. This timing element 17 is rendered operative when a switch 35 coupled with the operating switch in the battery circuit is opened, and said element 17 performs its changeover function, as already mentioned, preparatively after a number of hours, if it has not been previously reset by premature closure of the switch 35. Thus, as soon as the battery circuit is reclosed, the readjustment of the counter 11 takes place within a short time by way of the changed-over switches 8 and 8A, and after termination of this procedure the timing element 17 is reset again in any desired way (not shown), which has the result of resetting the switches 8 and 8A and also of disconnecting the adjusting pulse generator 9 and, accordingly, the indicating device is changed over to normal operation.

We claim:

1. In a device for determining the charge condition of a secondary electric storage battery and including an integrator comprising a pulse generator for producing pulses at a frequency which can be varied in accordance with the magnitude of a load current driven by the battery, and an up-down counter for counting the pulses from the pulse generator in a sense dependent upon the battery current direction, the improvement comprising an adjusting pulse generator, switch means for selectively coupling said first-mentioned pulse generator or said adjusting pulse generator to the up-down counter, a function generator programmable in accordance with the relationship between no-load voltage, temperature and charge condition of the battery concerned to generate a signal representing the charge condition associated with a particular detected no-load voltage and temperature, and a comparator connected to receive and to compare the said signal from the function generator, and a signal representing the counter setting, and to control the supply of pulses to the up-down counter and the sense of counting therein, when the adjustment pulse generator is coupled thereto, in accord with the result of the comparison.

2. A device according to claim 1 wherein the switch means includes a timer which is operable to respond to the disconnection of the battery from its load circuit to commence timing, and to control the switch means to couple the adjustment pulse generator to the up-down counter after the elapse of a predetermined switching time, said timer also being arranged to be reset on the one hand if the battery is reconnected before said switching time elapses, and on the other hand by completion of the adjustment of the counter setting.

3. A device according to claim 1 including first means for producing a voltage proportional in magnitude to the magnitude of a battery current and having a polarity dependent upon the direction of flow, that is, charge of discharge, of the battery current, and second means coupled to the first means for producing a control signal in accordance with the polarity of said voltage, the output of said first means being connected to the first-mentioned pulse generator and the control signal from the second means being connected to a counting sense control input of the up-down counter.

4. A device according to claim 1 wherein the up-down counter has a first input for receiving count pulses to be counted, and a second input for which controls the sense of counting, and wherein the switching means includes first and second switches, each having first and second inputs and an output, the outputs of the first and second switches being connected to said first and second inputs of the up-down counter respectively, the first and second inputs of the first switch being coupled to the first-mentioned pulse generator and to the adjustment pulse generator respectively, and the first and second inputs of the second switch being coupled to receive a signal indicating the direction of battery current and an output of the comparator, respectively, the two switches being selectively operable together to connect simultaneously their first inputs or their second inputs to their respective outputs.

* * * * *